(12) United States Patent
Zhan et al.

(10) Patent No.: US 12,068,158 B2
(45) Date of Patent: Aug. 20, 2024

(54) METHOD FOR FABRICATING SEMICONDUCTOR STRUCTURE

(71) Applicant: CHANGXIN MEMORY TECHNOLOGIES, INC., Hefei (CN)

(72) Inventors: Kangshu Zhan, Hefei (CN); Qiang Wan, Hefei (CN); Penghui Xu, Hefei (CN); Tao Liu, Hefei (CN); Sen Li, Hefei (CN); Jun Xia, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 379 days.

(21) Appl. No.: 17/474,067

(22) Filed: Sep. 14, 2021

(65) Prior Publication Data

US 2022/0344156 A1   Oct. 27, 2022

Related U.S. Application Data

(63) Continuation of application No. PCT/CN2021/111948, filed on Aug. 11, 2021.

(30) Foreign Application Priority Data

Apr. 23, 2021   (CN) .......................... 202110440942.1

(51) Int. Cl.
*H01L 21/033* (2006.01)
*H01L 21/311* (2006.01)

(52) U.S. Cl.
CPC .... *H01L 21/0332* (2013.01); *H01L 21/31144* (2013.01)

(58) Field of Classification Search
CPC ........... H01L 21/0332; H01L 21/31144; H01L 21/0337
See application file for complete search history.

(56) References Cited

U.S. PATENT DOCUMENTS 8,029,688 B2 * 10/2011 Yi ..................... H01L 21/02118
                                                         438/689
9,378,973 B1    6/2016 Tung et al.
(Continued)

FOREIGN PATENT DOCUMENTS

CN        101416278 B      4/2011
CN        103839781 A      6/2014
(Continued)

OTHER PUBLICATIONS

State Intellectual Property Office of the People's Republic of China, First Office Action and Search Report Issued in Application No. 202110440942.1, Apr. 30, 2024, 9 pages,.

*Primary Examiner* — Dale E Page
*Assistant Examiner* — Quovaunda Jefferson
(74) *Attorney, Agent, or Firm* — Kilpatrick Townsend & Stockton LLP (57) ABSTRACT

Embodiment relates to a method for fabricating a semiconductor structure. The method includes: forming a first pattern on the first region and forming a second pattern on the second region, wherein the first pattern includes a plurality of first sub-patterns, a first gap is provided between adjacent two of the plurality of first sub-patterns, a width of the first gap is a first pitch, and wherein the second pattern includes a plurality of second sub-patterns, a second gap is provided between adjacent two of the plurality of second sub-patterns, a width of the second gap is a second pitch, and the second pitch is greater than the first pitch; forming a first mask layer on a sidewall of the first pattern, and forming a second mask layer on a sidewall of the second pattern; and removing the first pattern and the second pattern.

14 Claims, 9 Drawing Sheets

(56) References Cited

U.S. PATENT DOCUMENTS

| | | | |
|---|---|---|---|
| 11,456,174 B2* | 9/2022 | Hanqiuhua | H01L 21/0337 |
| 2002/0121241 A1* | 9/2002 | Nguyen | C23C 16/45544 |
| | | | 118/723 ME |
| 2005/0214695 A1* | 9/2005 | Kato | H01L 21/0275 |
| | | | 430/323 |
| 2009/0176376 A1 | 7/2009 | Yi et al. | |
| 2014/0273441 A1* | 9/2014 | Kim | H01L 21/31144 |
| | | | 438/666 |
| 2016/0155662 A1 | 6/2016 | Lee et al. | |
| 2017/0148643 A1 | 5/2017 | Ham et al. | |
| 2020/0219889 A1 | 7/2020 | Lin et al. | |
| 2021/0035803 A1* | 2/2021 | Junhong | H01L 21/3086 |

FOREIGN PATENT DOCUMENTS

| | | |
|---|---|---|
| CN | 104409444 A | 3/2015 |
| CN | 108611592 A | 10/2018 |
| CN | 109559978 A | 4/2019 |
| CN | 110061007 A | 7/2019 |
| CN | 110660808 A | 1/2020 |
| CN | 111370299 A | 7/2020 |
| CN | 112309838 A | 2/2021 |
| CN | 112447604 A | 3/2021 |
| KR | 20030051000 A | 6/2003 |

\* cited by examiner

METHOD FOR FABRICATING SEMICONDUCTOR STRUCTURE

CROSS-REFERENCE TO RELATED APPLICATION

This application is a continuation of PCT/CN2021/111948, filed on Aug. 11, 2021, which claims priority to Chinese Patent Application No. 202110440942.1 titled "METHOD FOR FABRICATING SEMICONDUCTOR STRUCTURE" and filed to the State Intellectual Property Office on Apr. 23, 2021, the entire contents of which are incorporated herein by reference.

TECHNICAL FIELD

The present disclosure relates to the field of integrated circuit technology, and more particularly, to a method for fabricating a semiconductor structure.

BACKGROUND

At present, limited by minimum sizes of masks, miniaturization of minimum sizes of patterns on semiconductor structures is implemented generally by means of two-time pattern transfer or four-time pattern transfer, etc. In different regions of the same semiconductor structure, the miniaturization of the minimum sizes of the patterns are required for some regions, and not required for some other regions.

However, the traditional technologies can only control each region of the semiconductor structure to be miniaturized synchronously, and cannot miniaturize the minimum sizes of patterns in some regions while not miniaturizing the minimum sizes of patterns in some other regions.

SUMMARY

According to various embodiments of the present disclosure, there is provided a method for fabricating a semiconductor structure.

The present disclosure provides a method for fabricating a semiconductor structure. The method includes:

forming a first pattern on the first region and forming a second pattern on the second region, the first pattern comprising a plurality of first sub-patterns, a first gap being provided between adjacent two of the plurality of first sub-patterns, a width of the first gap being a first pitch, the second pattern comprising a plurality of second sub-patterns, a second gap being provided between adjacent two of the plurality of second sub-patterns, a width of the second gap being a second pitch, the second pitch being greater than the first pitch;

forming a first mask layer on a sidewall of the first pattern, and forming a second mask layer on a sidewall of the second pattern, the first mask layer filling up the first gap, and the second mask layer not filling up the second gap; and removing the first pattern and the second pattern.

In the method for fabricating a semiconductor structure provided by the present disclosure, a width of the second gap between the adjacent two of the plurality of second sub-patterns is greater than a width of the first gap between the adjacent two of the plurality of first sub-patterns, such that the first mask layer formed on the sidewall of the first gap can be controlled to fill up the first gap, and the second mask layer formed on the sidewall of the second gap can be controlled not to fill up the second gap. In this way, when the semiconductor structure is etched by using the first mask layer and the second mask layer as masks, a minimum size of a pattern formed in the first region is not miniaturized, and a minimum size of a pattern formed in the second region is miniaturized.

BRIEF DESCRIPTION OF THE DRAWINGS

To describe the technical solutions in the embodiments of the present disclosure or the existing technologies more clearly, the accompanying drawings required for describing the embodiments or the existing technologies will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

For ease of understanding the present disclosure, the present disclosure will be described more fully hereinafter with reference to the accompanying drawings. Some embodiments of the present disclosure are provided in the accompanying drawings. The present disclosure may, however, be embodied in many different forms and should not be limited to the embodiments set forth herein. Rather, these embodiments are provided so that the present disclosure will be more thorough and complete.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure.

It should be understood that when an element or layer is referred to as being "on", "adjacent to", "connected to" or "coupled to" other elements or layers, it may be directly on, adjacent to, connected or coupled to the other elements or layers, or intervening elements or layers may be present. In contrast, when an element is referred to as being "directly on", "directly adjacent to", "directly connected to" or "directly coupled to" other elements or layers, there are no intervening elements or layers present. It should be understood that although the terms first, second, third, etc. may be employed to describe various elements, components, regions, layers, doping types and/or sections, these elements, components, regions, layers, doping types and/or sections should not be limited by these terms. These terms are only employed to distinguish one element, component, region, layer, doping type, or section from another element, component, region, layer, doping type, or section. Thus, without departing from the teachings of the present disclosure, a first element, component, region, layer, doping type or portion discussed below may be represented as a second element, component, region, layer or portion. For example, a first doping type may be a second doping type, and similarly, the second doping type may be the first doping type. Furthermore, the first doping type and the second doping type may be different doping types. For example, the first doping type may be a P type and the second doping type may be an N type, or the first doping type may be the N type and the second doping type may be the P type.

Spatially relative terms such as "below", "under", "lower", "beneath", "above", "upper" and the like may be used herein to describe relationships between one element or feature as shown in the figures and another element(s) or feature(s). It should be understood that the spatially relative terms may be intended to encompass different orientations of a device in use or operation in addition to the orientation depicted in the figures. For example, if the device in the figures is turned over, elements or features described as "under", "beneath" or "below" other elements would then be oriented "above" the other elements or features. Thus, the example term "under", "below" or "beneath" may encompass both an orientation of above and below. In addition, the device may also be otherwise oriented (for example, rotated 90 degrees or at other orientations) and the spatially relative descriptors used herein should be interpreted accordingly.

As used herein, the singular forms of "a", "one" and "said/the" are also intended to include plural forms, unless the context clearly indicates otherwise. It should also be understood that the terms "comprising" and/or "including", when used in this specification, may determine the presence of the described features, integers, steps, operations, elements and/or components, but do not preclude the presence or addition of one or more other features, integers, steps, operations, elements, components, and/or groups thereof. Meanwhile, as used herein, the term "and/or" includes any and all combinations of related listed items.

Embodiments of the present disclosure are described herein with reference to cross-sectional illustrations serving as schematic illustrations of embodiments (and intermediate structures) of the present disclosure. As such, variations from the shapes of the illustrations as a result, for example, of manufacturing techniques and/or tolerances, may be expected. Thus, embodiments of the present disclosure should not be construed as being limited to particular shapes of regions illustrated herein but may include deviations in shapes that result, for example, from fabrication technologies. For example an implanted region shown as a rectangle typically has circular or curved features and/or implantation concentration gradients at its edges rather than a binary change from the implanted region to a non-implanted region. Likewise, a buried region formed by implantation may result in some implantations in a region between the buried region and a surface through which the implantation proceeds. Thus, regions illustrated in the figures are schematic in nature and their shapes do not necessarily illustrate the actual shape of a region of the device and do not limit the scope of the present disclosure.

Figure 1:
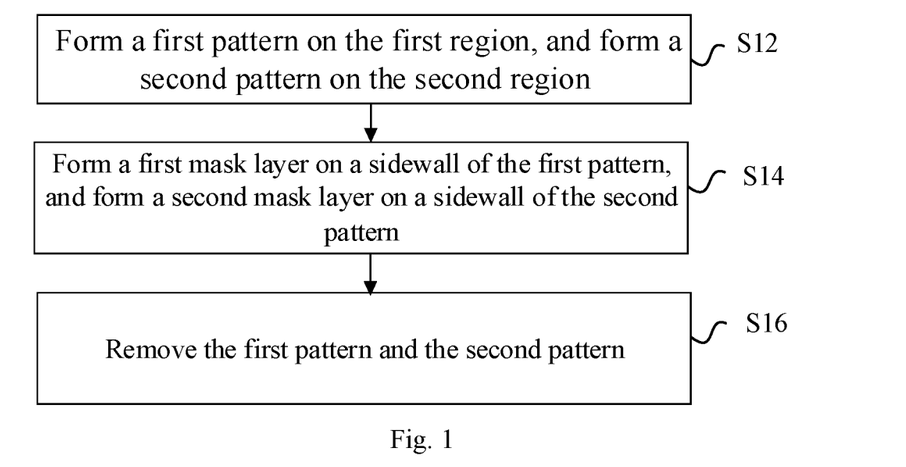
FIG. 1 is a flowchart of a method for fabricating a semiconductor structure according to an embodiment of the present disclosure.

Referring to FIG. 1, the present disclosure provides a method for fabricating a semiconductor structure. The semiconductor structure comprises a first region and a second region, and the first region is adjacent to the second region. The method for fabricating a semiconductor structure comprises the following steps:

Step S12: forming a first pattern on the first region and forming a second pattern on the second region.

In this embodiment, the first pattern comprises a plurality of first sub-patterns, a first gap is provided between adjacent two of the plurality of first sub-patterns, and a width of the first gap is a first pitch. The second pattern comprises a plurality of second sub-patterns, a second gap is provided between adjacent two of the plurality of second sub-patterns, and a width of the second gap is a second pitch, wherein the second pitch is greater than the first pitch.

Step S14: forming a first mask layer on a sidewall of the first pattern, and forming a second mask layer on a sidewall of the second pattern.

In this embodiment, the first mask layer fills up the first gap, and the second mask layer does not fill up the second gap.

Step S16: removing the first pattern and the second pattern.

In the method for fabricating a semiconductor structure provided by the above embodiment, a width of the second gap between the adjacent two of the plurality of second sub-patterns is greater than a width of the first gap between the adjacent two of the plurality of first sub-patterns, such that the first mask layer formed on the sidewall of the first gap can be controlled to fill up the first gap, and the second mask layer formed on the sidewall of the second gap can be controlled not to fill up the second gap. In this way, when the semiconductor structure is etched by using the first mask layer and the second mask layer as masks, a minimum size of a pattern formed in the first region is not miniaturized, and a minimum size of a pattern formed in the second region is miniaturized.

Figure 2:
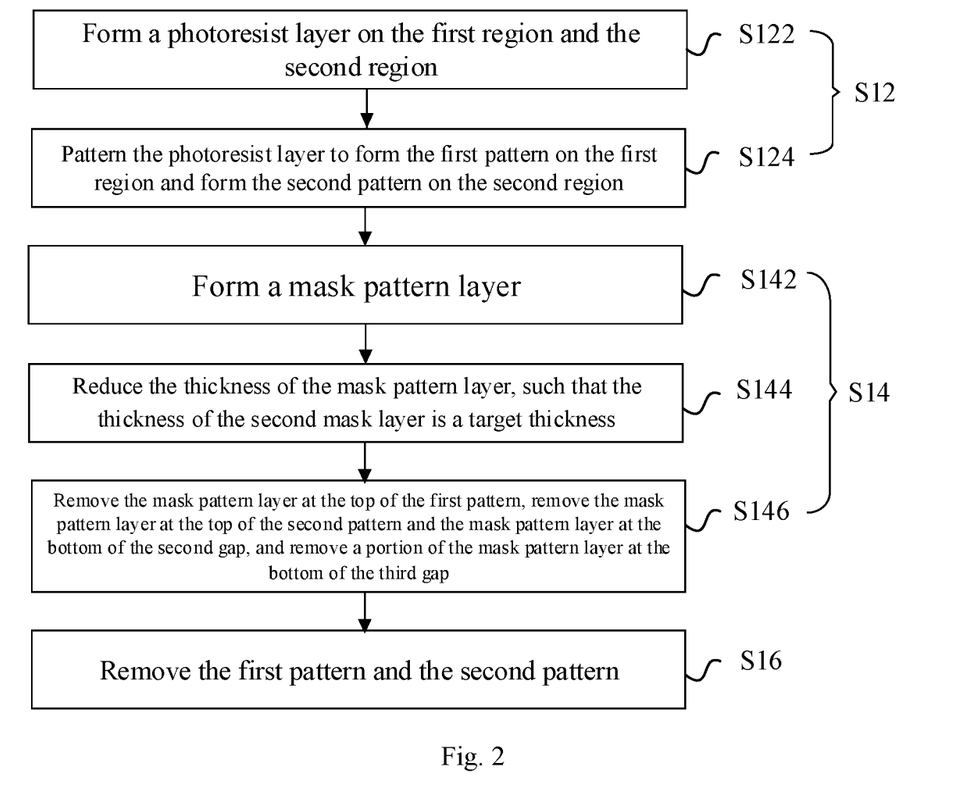
FIG. 2 is a flowchart of steps of a method for fabricating a semiconductor structure according to the embodiment of FIG. 1 of the present disclosure.
Figure 3:
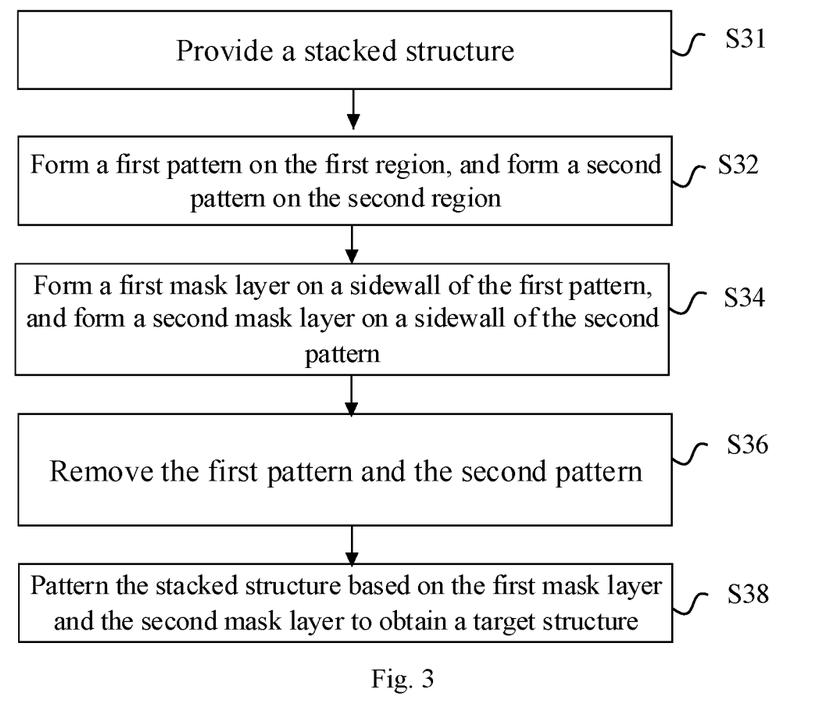
FIG. 3 is a flowchart of a method for fabricating a semiconductor structure according to another embodiment of the present disclosure.

In some examples, referring to FIG. 2, the Step S12 of forming a first pattern on the first region and forming a second pattern on the second region includes Steps S122 and S124.

Step S122: forming a photoresist layer on the first region and the second region.

Figure 6:
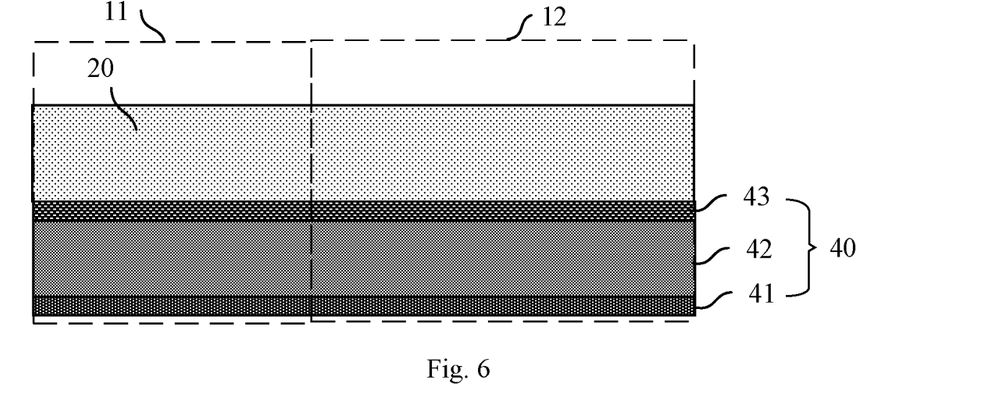
FIGS. 6 to 12 are cross-sectional views of structures obtained in each step of a method for fabricating a semiconductor structure according to an embodiment of the present disclosure.

In some embodiments, referring to FIG. 6, the photoresist (PR) layer 20 may be a positive photoresist or a negative photoresist. The photoresist layer 20 may be formed by means of spin coating or slit coating and the like, and the photoresist layer 20 covers the first region 11 and the second region 12.

Step S124: patterning the photoresist layer to form the first pattern on the first region and form the second pattern on the second region.

Figure 7:
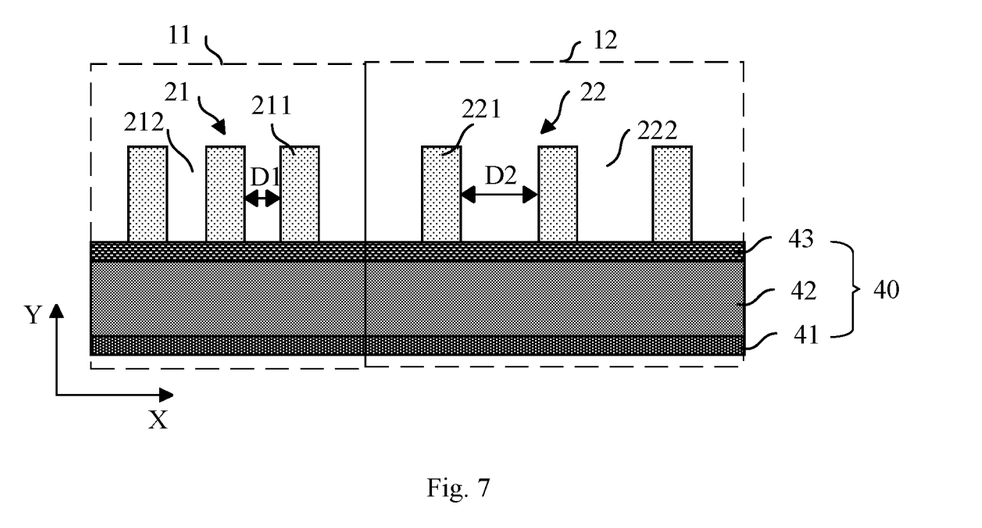

In some embodiments, referring to FIG. 6 and FIG. 7, the photoresist layer 20 is exposed by means of a mask, and then the photoresist layer 20 is developed and baked, such that the photoresist layer 20 forms a first pattern 21 on a first region 11 and forms a second pattern 22 on a second region 12. On the first region 11, the first pattern 21 includes a plurality of first sub-patterns 211, a first gap 212 is provided between adjacent two of the plurality of first sub-patterns 211, and a width (the width in the present disclosure refers to a length in the direction X as shown in FIG. 7) of the first gap 212 is a first pitch D1. On the second region 12, the second pattern 22 includes a plurality of second sub-patterns 221, a second gap 222 is provided between adjacent two of the plurality of second sub-patterns 221, and a width of the second gap 222 is a second pitch D2. The first pitch D1, the second pitch D2, and the widths of the plurality of first sub-patterns 211 and the plurality of second sub-patterns 221 formed by the photoresist layer 20 may be controlled by configuring shapes of the patterns on the mask according to actual requirements. In this embodiment, the second pitch D2 is greater than the first pitch D1.

In some examples, referring to FIG. 2, the Step S14 of forming a first mask layer on a sidewall of the first pattern, and forming a second mask layer on a sidewall of the second pattern includes Steps S142 to S146.

Step S142: forming a mask pattern layer.

Figure 8:
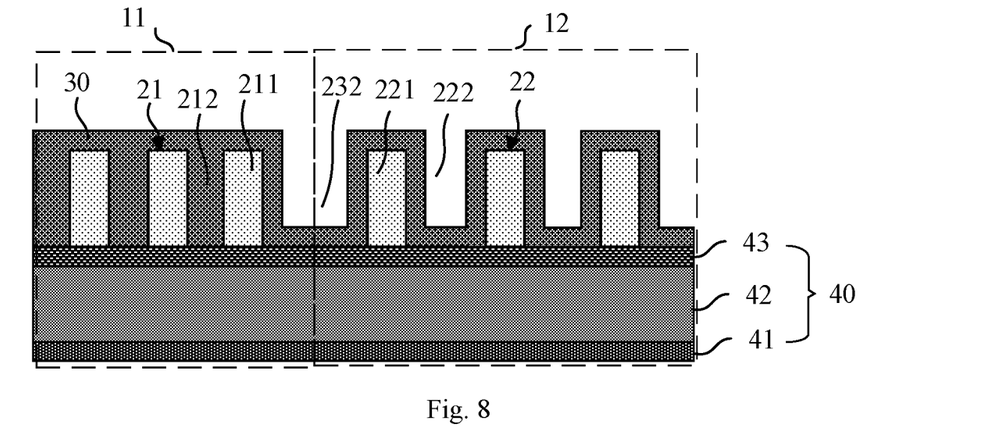

In some embodiments, referring to FIG. 8 the mask pattern layer 30 may include an oxide (Ox) layer. The mask pattern layer 30 may be formed by means of a process such as atomic layer deposition (ALD). The mask pattern layer 30 covers a top and a sidewall of the first pattern 21 and fills up the first gap 212, and the mask pattern layer 30 covers a top and a sidewall of the second pattern 22 and a bottom of the second gap 222. A third gap 232 is provided between each of the plurality of first sub-patterns 211 and each of the plurality of second sub-patterns 221 that are adjacent to each other, and the mask pattern layer 30 also covers a bottom of the third gap 323.

In some embodiments, it may be controlled that the mask pattern layer 30 formed on a top of the first region 11 is flush with the mask pattern layer 30 formed on a top of the second region 12.

In some examples, a thickness of the mask pattern layer 30 is a first thickness. The first pitch D1 is less than twice the first thickness, such that after the mask pattern layer 30 is deposited, the mask pattern layer 30 can cover the top and the sidewall of the first pattern 21 and can fill up the first gap 212 on the first region 11. The second pitch D2 is greater than twice the first thickness, such that after the mask pattern layer 30 is deposited, the mask pattern layer 30 can cover, on the second region 12, the top and the sidewall of the second pattern 22 and the bottom of the second gap 222, and the mask pattern layer 30 does not fill up the second gap 222. A width of the third gap 232 may also be greater than twice the first thickness, such that after the mask pattern layer 30 is deposited, the mask pattern layer 30 also covers the bottom of the third gap 232, and the mask pattern layer 30 may not fill up the third gap 232.

In other examples, a mask pattern material layer is deposited for many times to obtain the mask pattern layer 30, wherein a thickness of the mask pattern material layer deposited each time is a second thickness. The first pitch D1 and the second pitch D2 are both greater than twice the second thickness, such that the mask pattern material layer neither fills up the first gap 212 nor fills up the second gap 222 after the mask pattern material layer is deposited for the first time. After the mask pattern material layer is cyclically deposited for many times, since the second pitch D2 is greater than the first pitch D1, the finally formed mask pattern layer 30 may be controlled to fill up the first gap 212 and not fill up the second gap 222. A width of the third gap 232 may also be greater than twice the second thickness, such that after the mask pattern material layer is cyclically deposited for many times, the mask pattern layer 30 formed also covers the bottom of the third gap 232, and the mask pattern layer 30 may not fill up the third gap 232.

Step S144: reducing the thickness of the mask pattern layer, such that the thickness of the second mask layer is a target thickness.

Figure 9:
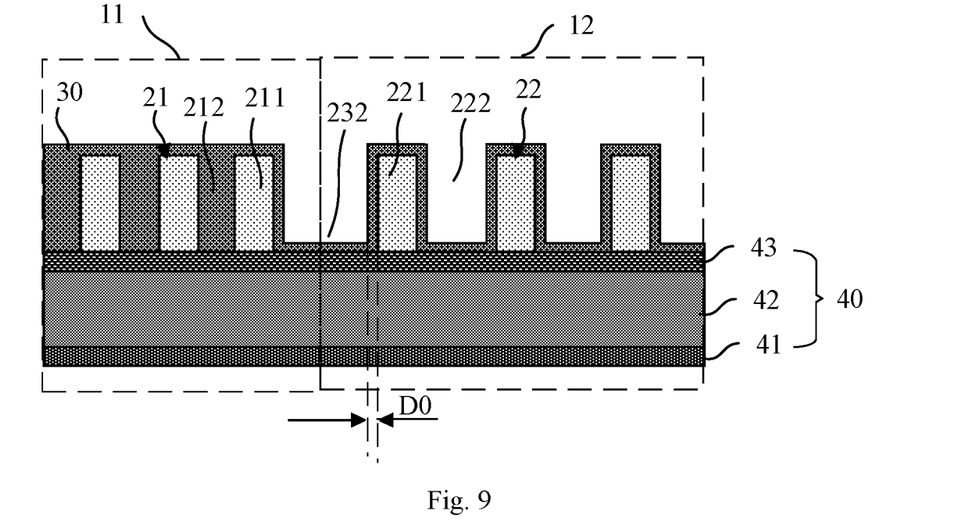

In some embodiments, referring to FIG. 9, the thickness of the mask pattern layer 30 may be reduced by means of a wet etching process. The thickness of the thinned mask pattern layer 30 is the target thickness D0. A value of the target thickness may be configured according to a size of a pattern desired to be formed in the second region 12 on the final semiconductor structure. The target thickness D0 should be greater than 0, such that the mask pattern layer 30 on the sidewall and the top of the second pattern 22 and the mask pattern layer 30 on the bottom of the second gap 222 are not completely removed. In Step S144, the first gap 212 is blocked by the mask pattern layer 30 on the first region 11, the process of reducing the thickness of the mask pattern layer 30 does not have a negative effect on the width of the mask pattern layer 30 in the first gap 212, and the mask pattern layer 30 still fills up the first gap 212. On the second region 12, the mask pattern layer 30 does not fill up the second gap 222, such that the thickness of the mask pattern layer 30 on the sidewall and the top of the second pattern 22 and on the bottom of the second gap 222 is reduced simultaneously in the process of reducing the thickness of the mask pattern layer 30, wherein these thicknesses may be equal to the target thickness D0. After a pattern on the mask pattern layer 30 on the second region 12 is transferred to the semiconductor structure, a width and a minimum size of the pattern in the second region 12 may be controlled by changing a size of the target thickness D0. When the mask pattern layer 30 does not fill up the third gap 232, the thickness of the mask pattern layer 30 on the sidewall of the first pattern 21 near a side of the second pattern 22 and the thickness of the mask pattern layer 30 at the bottom of the third gap 232 are reduced.

It is to be noted that Step S144 may be selectively performed. In other examples, Step S146 may also be performed directly without reducing the thickness of the mask pattern layer 30.

Step S146: removing the mask pattern layer at the top of the first pattern, removing the mask pattern layer at the top of the second pattern and the mask pattern layer at the bottom of the second gap, and removing a portion of the mask pattern layer at the bottom of the third gap.

Figure 10:
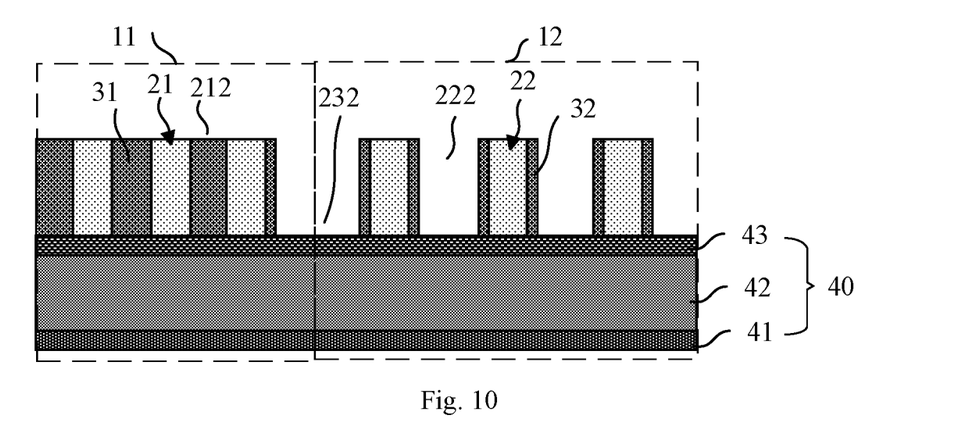

In some embodiments, referring to FIG. 10, after Step S146 is performed, a first mask layer 31 is formed on the first region 11, and a second mask layer 32 is formed on the second region 12. The first mask layer 31 fills up the first gap 212, and the second mask layer 32 does not fill up the second gap 222.

Figure 11:
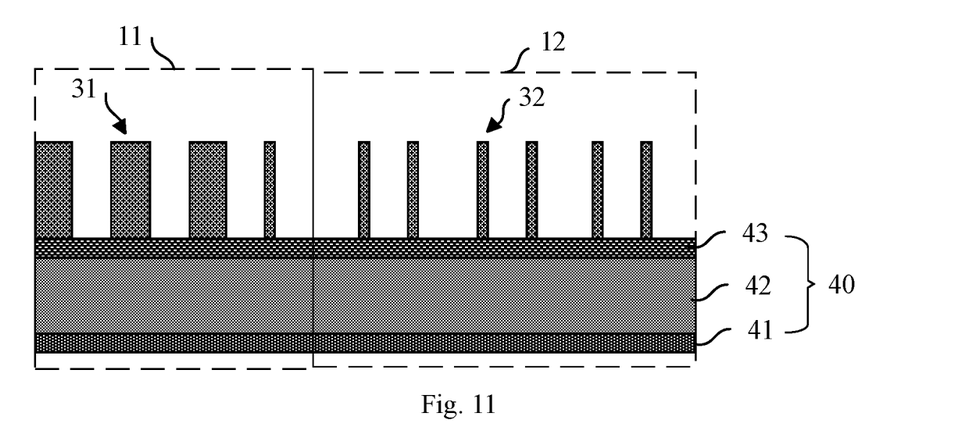

In some examples, referring to FIG. 10 and FIG. 11, the first pattern 21 and the second pattern 22 may be removed in Step S16 by means of a dry etching process or a wet etching process, etc.

In this embodiment, by controlling the width of each of the plurality of first sub-patterns 211, the width of each of the plurality of second sub-patterns 221, the first pitch D1, the second pitch D2, and the size of the target thickness D0 of the second mask layer 32, a minimum size of a pattern on the second mask layer 32 is miniaturized twice compared to a minimum size of the second pattern 22, such that the minimum size of a pattern on the second region 12 of the semiconductor structure is miniaturized twice compared to the minimum size of the second pattern 22 when the second region 12 of the semiconductor structure is subsequently etched using the second mask layer 32 as a mask. Furthermore, the first gap 212 is filled up with the first mask layer 31, that is, the first gap 212 is blocked by the first mask layer 31. In this case, the minimum size of the pattern on the first mask layer 31 on the first region 11 is not miniaturized compared to the minimum size of the first pattern 21, such that the minimum size of the pattern on the semiconductor structure on the first region 11 is not miniaturized compared to the minimum size of the first pattern 21 when the first region 11 of the semiconductor structure is subsequently etched using the first mask layer 31 as a mask.

In a second embodiment, the method for fabricating a semiconductor structure includes following steps:

Step S31: providing a stacked structure;

Step S32: forming a first pattern on the first region and forming a second pattern on the second region;

Step S34: forming a first mask layer on a sidewall of the first pattern, and forming a second mask layer on a sidewall of the second pattern;

Step S36: removing the first pattern and the second pattern; and

Step S38: patterning the stacked structure based on the first mask layer and the second mask layer to obtain a target structure.

In some embodiments, referring to FIG. 6 to FIG. 12, there is provided a stacked structure 40, which includes a first region 11 and a second region 12. The first pattern 21 is formed on the first region 11 of the stacked structure 40, and the second pattern 22 is formed on the second region 12 of the stacked structure 40. Steps S32 to S36 may be the same as or similar to Steps S12 to S16 in the above embodiment respectively, and thus detailed descriptions thereof are omitted here. The stacked structure 40 is patterned based on the first mask layer 31 and the second mask layer 32 to obtain the target structure. On the first region 11, a minimum size of a pattern on the first mask layer 31 is not miniaturized compared to the minimum size of the first pattern 21, and thus the minimum size of the pattern on the first region 11 of the stacked structure 40 patterned based on the first mask layer 31 is not miniaturized compared to the minimum size of the first pattern 21. On the second region 12, a minimum size of a pattern on the second mask layer 32 is miniaturized twice compared to the minimum size of the second pattern 22, and thus the minimum size of the pattern on the second region 12 of the stacked structure 40 patterned based on the second mask layer 32 is miniaturized twice compared to the minimum size of the second pattern 22. In this embodiment, it can be implemented that the minimum size of the pattern on the first region 11 of the stacked structure 40 is not miniaturized after a two-time pattern transfer, and the minimum size of the pattern on the second region 12 is miniaturized twice.

Figure 12:
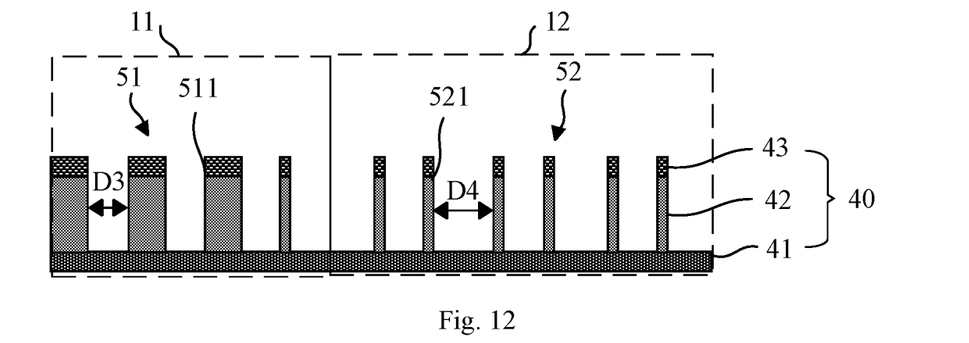

In some examples, the stacked structure 40 includes a first dielectric layer 41, a hard mask layer 42, and a second dielectric layer 43 stacked in sequence from bottom to top. Both the first pattern 21 and the second pattern 22 are positioned above the second dielectric layer 43. Step S38 of the patterning the stacked structure based on the first mask layer and the second mask layer comprises: patterning the second dielectric layer 43 and the hard mask layer 42 based on the first mask layer 31 and the second mask layer 32.

In some examples, both the first dielectric layer 41 and the second dielectric layer 43 include a silicon oxynitride (SiON) layer. The hard mask layer 42 includes a carbon layer. A material of the first dielectric layer 41 may be the same as that of the second dielectric layer 43, and a material of the hard mask layer 42 is different from the material of the first dielectric layer 41 and the material of the second dielectric layer 43.

In some examples, the target structure includes a first target structure 51 and a second target structure 52. The first target structure 51 is positioned in the first region 11, and the second target structure 52 is positioned in the second region 12. The first target structure 51 includes a plurality of first target substructures 511, and the second target structure 52 includes a plurality of second target substructures 521, wherein number of the plurality of second target substructures 521 is greater than that of the plurality of first target substructures 511.

In some embodiments, the number of the plurality of first target substructures 511 may be equal to the number of the plurality of first sub-patterns 211 plus one, i.e., N1+1. The width of each of the N1 first target substructures 511 far away from the second region 12 may be equal to the corresponding first pitch D1, and a pitch D3 between the N1+1 first target substructures 511 may be equal to the width of the corresponding first sub-pattern 211. In some embodiments, the pitches between the plurality of first sub-patterns 211 may be set to be equal, such that the widths of the N1 first target substructures 511 far away from the second region 12 are equal. The widths of the plurality of first sub-patterns 211 may also be set to be equal, such that the pitches D3 of the plurality of first target substructures 511 are equal. The pitches between the plurality of first sub-patterns 211 and the widths of the plurality of first sub-patterns 211 may also be set to be equal, such that the pitches D3 between the plurality of first target substructures 511 are equal to the first pitch D1.

The number of the plurality of second target substructures 521 may be equal to twice the number N2 of the plurality of second sub-patterns 221. The widths of the plurality of second target substructure 521 may be equal to the target thickness D0 of the second mask layer 32. In some embodiments, the widths of the plurality of second sub-pattern 221s may be set equal to D2−2D0, such that pitches D4 between the plurality of second target substructures 521 are equal. The second pitch D2 may also be set equal to 4D0, such that the pitches D4 between the plurality of second target substructures 521 are equal to half of the second pitch D2.

Figure 4:
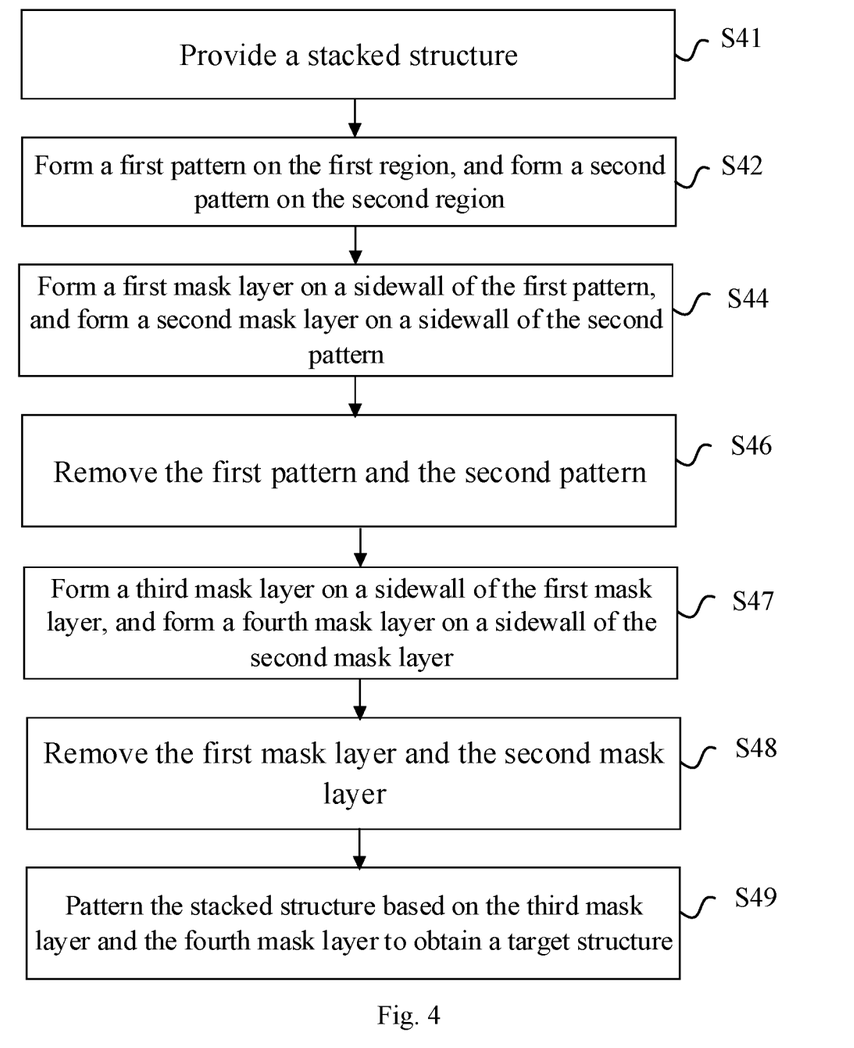
FIG. 4 is a flowchart of a method for fabricating a semiconductor structure according to yet another embodiment of the present disclosure.

In a third embodiment, referring to FIG. 4, the method for fabricating a semiconductor structure includes the following steps:

Step S42: forming a first pattern on the first region, and forming a second pattern on the second region;

Step S44: forming a first mask layer on a sidewall of the first pattern, and forming a second mask layer on a sidewall of the second pattern;

Step S46: removing the first pattern and the second pattern; and

Step S47: forming a third mask layer on a sidewall of the first mask layer, and forming a fourth mask layer on the second mask layer; and Step S48: removing the first mask layer and the second mask layer.

In some embodiments, referring to FIG. 6 to FIG. 11 and FIG. 13 to FIG. 14, Steps S42 to S46 may be the same as or similar to Steps S12 to S16 respectively, and thus detailed descriptions thereof are omitted here. The first mask layer 31 includes a plurality of third sub-patterns 611, a fourth gap 612 is provided between adjacent two of the plurality of third sub-patterns 611, and a width of the fourth gap 612 is a fourth pitch. The second mask layer 32 includes a plurality of fourth sub-patterns 621, a fifth gap 622 is provided between adjacent two of the plurality of fourth sub-patterns 621, and a width of the fifth gap 622 is a fifth pitch. The fifth pitch is greater than the fourth pitch, such that the third mask layer 71 is controlled to fill up the fourth gap 612, and the fourth mask layer 72 is controlled not to fill up the fifth gap 622. Reference may be made to the method of forming the first mask layer 31 in the above-described embodiment for the method of forming the third mask layer 71, and reference may be made to the method of forming the second mask layer 32 in the above-described embodiment for the method of forming the fourth mask layer 72. The first mask layer 31 and the second mask layer 32 may be removed by means of a process such as a wet etching process or a dry etching process. Materials of the third mask layer 71 and the fourth mask layer 72 may be selected according to actual needs, and the materials thereof are different from the materials forming the first mask layer 31 and the second mask layer 32.

Figure 13:
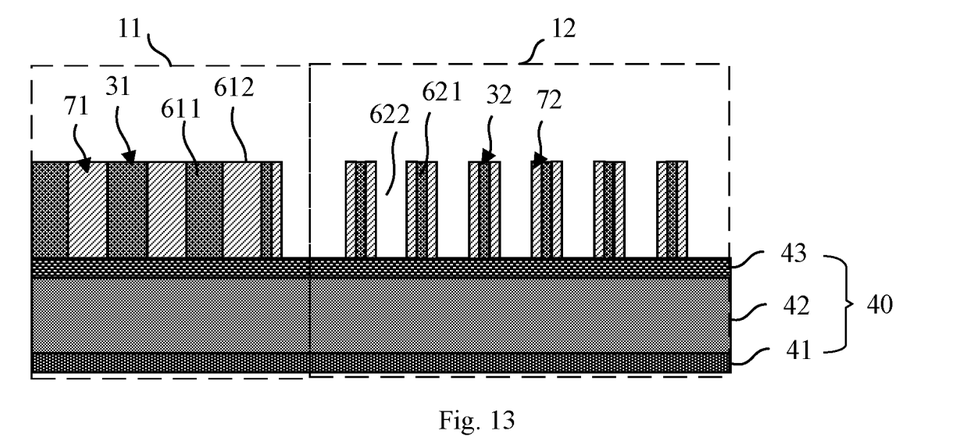
FIGS. 13 to 15 are cross-sectional views of structures obtained in each step of a method for fabricating a semiconductor structure according to another embodiment of the present disclosure.
Figure 14:
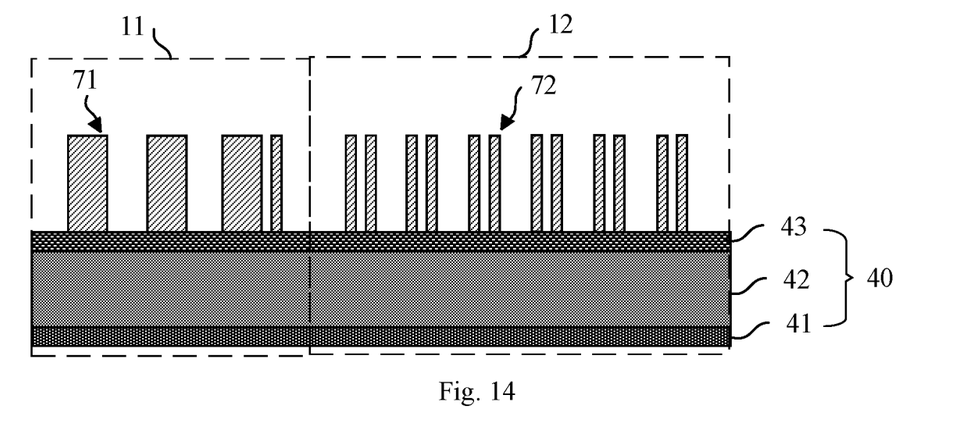

In this embodiment, by controlling the width of each of the plurality of first sub-patterns 211, the width of each of the plurality of second sub-patterns 221, the first pitch D1, the second pitch D2, the target thickness of the second mask layer 32, and the target thickness of the fourth mask layer 72, a minimum size of a pattern on the fourth mask layer 72 on the second region 12 is miniaturized twice compared to a minimum size of a pattern on the second mask layer 32, i.e., is miniaturized fourfold compared to a minimum size of the second pattern 22, such that the minimum size of a pattern on the second region 12 of the semiconductor structure is miniaturized fourfold compared to the minimum size of the second pattern 22 when the semiconductor structure is subsequently patterned using the fourth mask layer 72 as a mask. Furthermore, the fourth gap 612 is filled up with the third mask layer 71, that is, the fourth gap 612 is blocked by the third mask layer 71. In this case, the minimum size of the pattern on the third mask layer 71 on the first region 11 is not miniaturized compared to the minimum size of the pattern on the first mask layer 31, and the minimum size of the pattern on the third mask layer 71 on the first region 11 is not miniaturized compared to the minimum size of the first pattern 21, such that the minimum size of the pattern on the first region 11 on the semiconductor structure is not miniaturized compared to the minimum size of the first pattern 21 when the semiconductor structure is subsequently patterned using the third mask layer 71 as a mask.

In a fourth embodiment, referring to FIG. 4, the method for fabricating a semiconductor structure includes the following steps:

Step S41: providing a stacked structure;

Step S42: forming a first pattern on the first region, and forming a second pattern on the second region;

Step S44: forming a first mask layer on a sidewall of the first pattern, and forming a second mask layer on a sidewall of the second pattern;

Step S46: removing the first pattern and the second pattern; and

Step S47: forming a third mask layer on a sidewall of the first mask layer, and forming a fourth mask layer on the second mask layer;

Step S48: removing the first mask layer and the second mask layer; and

Step S49: patterning the stacked structure based on the third mask layer and the fourth mask layer to obtain a target structure.

In some embodiments, referring to FIG. 6 to FIG. 11 and FIG. 13 to FIG. 15, Step S41 may be the same as or similar to the embodiment of Step S31. The stacked structure 40 includes a first region 11 and a second region 12. The first pattern 21 is formed on the first region 11 of the stacked structure 40, and the second pattern 22 is formed on the second region 12 of the stacked structure 40. After Steps S41 to S48 are performed, a third mask layer 71 is formed on the first region 11 of the stacked structure 40, and a fourth mask layer 72 is formed on the second region 12 of the stacked structure 40. The stacked structure 40 is patterned based on the third mask layer 71 and the fourth mask layer 72 to obtain a target structure.

Figure 15:
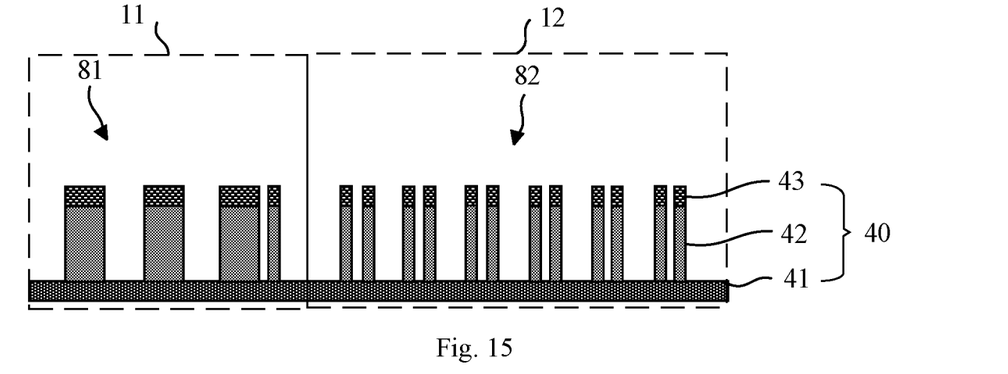

The target structure may include a first target structure 81 positioned in the first region 11 and a second target structure 82 positioned in the second region 12. On the first region 11, a minimum size of a pattern on the third mask layer 71 is not miniaturized compared to the minimum size of the first pattern 21, and thus the minimum size of the pattern (a pattern on the first target structure 81) on the first region 11 of the stacked structure 40 patterned based on the third mask layer 71 is not miniaturized compared to the minimum size of the first pattern 21. On the second region 12, a minimum size of a pattern on the fourth mask layer 72 is miniaturized fourfold compared to the minimum size of the second pattern 22, and thus the minimum size of the pattern (a pattern on the second target structure 82) on the second region 12 of the stacked structure 40 patterned based on the fourth mask layer 72 is miniaturized fourfold compared to the minimum size of the second pattern 22. In this embodiment, it can be implemented that the minimum size of the pattern on the first region 11 of the stacked structure 40 is not miniaturized after a four-time pattern transfer, and the minimum size of the pattern on the second region 12 is miniaturized fourfold.

Figure 5:
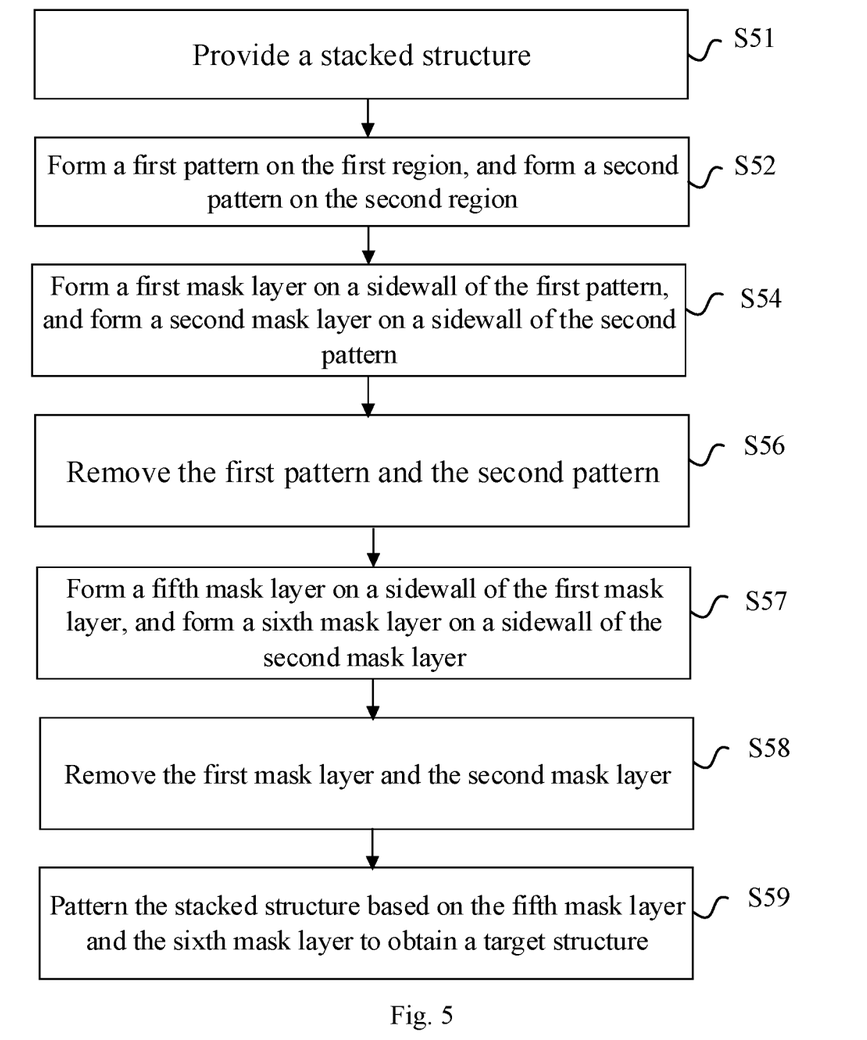
FIG. 5 is a flowchart of a method for fabricating a semiconductor structure according to yet another embodiment of the present disclosure.

In a fifth embodiment, referring to FIG. 5, the method for fabricating a semiconductor structure includes the following steps:

Step S52: forming a first pattern on the first region, and forming a second pattern on the second region;

Step S54: forming a first mask layer on a sidewall of the first pattern, and forming a second mask layer on a sidewall of the second pattern;

Step S56: removing the first pattern and the second pattern;

Step S57: forming a fifth mask layer on a sidewall of the first mask layer, and forming a sixth mask layer on a sidewall of the second mask layer; and Step S58: removing the first mask layer and the second mask layer.

In some embodiments, referring to FIG. 6 to FIG. 11 and FIG. 16 to FIG. 17, Steps S52 to S56 may be the same as or similar to Steps S12 to S16 respectively, and thus detailed descriptions thereof are omitted here. The first mask layer 31 includes a plurality of third sub-patterns 911, and a fourth gap 912 is provided between adjacent two of the plurality of third sub-patterns 911. The second mask layer 32 includes a plurality of fourth sub-patterns 921, and a fifth gap 922 is provided between adjacent two of the plurality of fourth sub-patterns 921. Reference may be made to the method of forming the second mask layer 32 in the above-described embodiment for the method of forming the fifth mask layer 1001 and the sixth mask layer 1002. The fifth mask layer 1001 formed does not fill up the fourth gap 912, and the sixth mask layer 1002 formed does not fill up the fifth gap 922. The thickness of the mask pattern layer (not shown in the figure) forming the fifth mask layer 1001 and the sixth mask layer 1002 is a third thickness. As long as it is ensured that the width of the fourth gap 912 and the width of the fifth gap 922 are both greater than twice the third thickness, and that the width of the fourth gap 912 is greater than, equal to or less than the width of the fifth gap 922, it can be implemented that the fifth mask layer 1001 does not fill up the fourth gap 912 and the sixth mask layer 1002 does not fill up the fifth gap 922. The first mask layer 31 and the second mask layer 32 may be removed by means of a process such as a wet etching process or a dry etching process. Materials of the fifth mask layer 1001 and the sixth mask layer 1002 may be selected according to actual needs, and the materials thereof are different from the materials forming the first mask layer 31 and the second mask layer 32.

Figure 16:
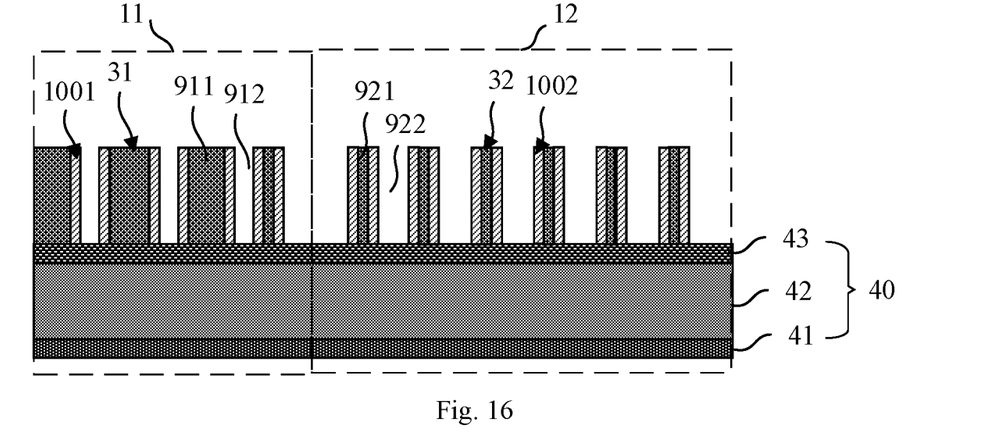
FIGS. 16 to 18 are cross-sectional views of structures obtained in each step of a method for fabricating a semiconductor structure according to yet another embodiment of the present disclosure.
Figure 17:
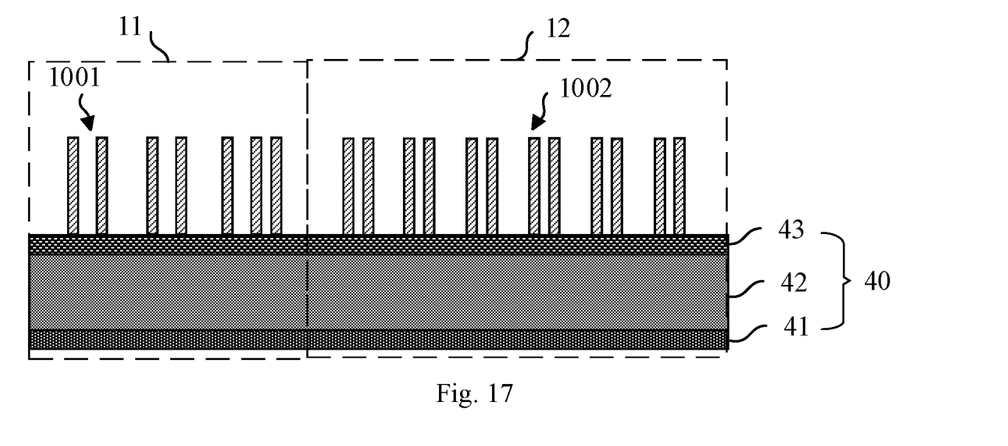
Figure 18:
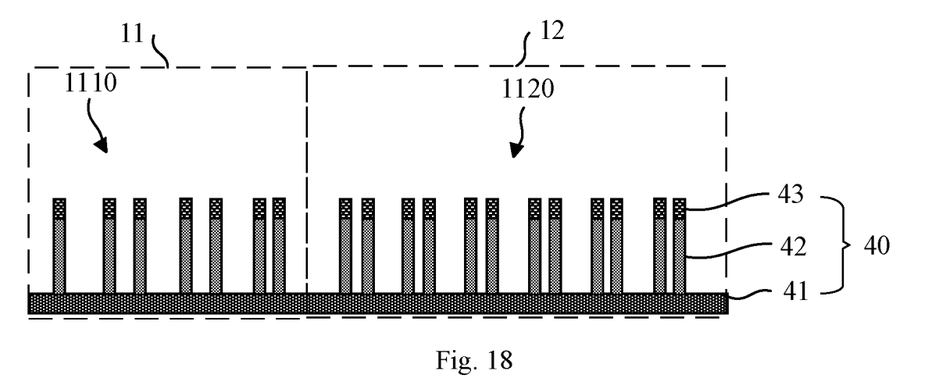

In this embodiment, by controlling the width of each of the plurality of first sub-patterns 211, the width of each of the plurality of second sub-patterns 221, the first pitch D1, the second pitch D2, the target thickness of the second mask layer 32, the target thickness of the fifth mask layer 1001, and the target thickness of the sixth mask layer 1002, a minimum size of a pattern on the sixth mask layer 1002 on the second region 12 may be miniaturized twice compared to a minimum size of a pattern on the second mask layer 32, i.e., miniaturized fourfold compared to a minimum size of the second pattern 22, such that the minimum size of a pattern on the second region 12 of the semiconductor structure is miniaturized fourfold compared to the minimum size of the second pattern 22 when the semiconductor structure is subsequently patterned using the sixth mask layer 1002 as a mask. Furthermore, the first gap 212 is filled up with the first mask layer 31, and the fourth gap 912 is not filled up with the fifth mask layer 1001. In this case, the minimum size of the pattern on the fifth mask layer 1001 on the first region 11 is miniaturized twice compared to the minimum size of the pattern on the first mask layer 31, and the minimum size of the pattern on the fifth mask layer 1001 on the first region 11 is miniaturized twice compared to the minimum size of the first pattern 21, such that the minimum size of the pattern on the first region 11 on the semiconductor structure is miniaturized twice compared to the minimum size of the first pattern 21 when the semiconductor structure is subsequently patterned using the fifth mask layer 1001 as a mask.

In a sixth embodiment, referring to FIG. 5, the method for fabricating a semiconductor structure includes the following steps:

Step S51: providing a stacked structure;

Step S52: forming a first pattern on the first region, and forming a second pattern on the second region;

Step S54: forming a first mask layer on a sidewall of the first pattern, and forming a second mask layer on a sidewall of the second pattern;

Step S56: removing the first pattern and the second pattern;

Step S57: forming a fifth mask layer on a sidewall of the first mask layer, and forming a sixth mask layer on the second mask layer;

Step S58: removing the first mask layer and the second mask layer; and

Step S59: patterning the stacked structure based on the fifth mask layer and the sixth mask layer to obtain a target structure.

In some embodiments, referring to FIG. 6 to FIG. 11 and FIG. 16 to FIG. 18, Step S51 may be the same as or similar to the embodiment of Step S31. The stacked structure 40 includes a first region 11 and a second region 12. The first pattern 21 is formed on the first region 11 of the stacked structure 40, and the second pattern 22 is formed on the second region 12 of the stacked structure 40. After Steps S51 to S58 are performed, a fifth mask layer 1001 is formed on the first region 11 of the stacked structure 40, and a sixth mask layer 1002 is formed on the second region 12 of the stacked structure 40. The stacked structure 40 is patterned based on the fifth mask layer 1001 and the sixth mask layer 1002 to obtain the target structure. The target structure may include a first target structure 1110 positioned in the first region 11 and a second target structure 1120 positioned in the second region 12. On the first region 11, a minimum size of a pattern on the fifth mask layer 1001 is miniaturized twice compared to the minimum size of the first pattern 21, and thus the minimum size of the pattern (a pattern on the first target structure 1110) on the first region 11 of the stacked structure 40 patterned based on the fifth mask layer 1001 is miniaturized twice compared to the minimum size of the first pattern 21. On the second region 12, a minimum size of a pattern on the sixth mask layer 1002 is miniaturized fourfold compared to the minimum size of the second pattern 22, and thus the minimum size of the pattern (a pattern on the second target structure 1120) on the second region 12 of the stacked structure 40 patterned based on the sixth mask layer 1002 is miniaturized fourfold compared to the minimum size of the second pattern 22. In this embodiment, it can be implemented that the minimum size of the pattern on the first region 11 of the stacked structure 40 is miniaturized twice after a four-time pattern transfer, and the minimum size of the pattern on the second region 12 is miniaturized fourfold, wherein a miniaturization proportion of the minimum size of the pattern on the first region 11 is different from a miniaturization proportion of the minimum size of the pattern on the second region 12.

It should be understood that although the steps in the flow diagrams of FIG. 1 to FIG. 5 are shown sequentially as indicated by the arrows, these steps are not necessarily performed sequentially in the order indicated by the arrows. It should be understood that unless expressly stated herein, the execution of these steps is not strictly limited in sequence, and these steps may be performed in other orders. Moreover, at least some of the steps in FIG. 1 to FIG. 5 may include a plurality of steps or a plurality of stages, which are not necessarily performed at the same moment, but may be executed at different moments, and the order of execution of these steps or stages is not necessarily performed sequentially, but may be performed alternately or alternately with at least a portion of the steps or stages of other steps or other steps.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express a plurality of implementations of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the present disclosure shall be subject to the appended claims.

What is claimed is:

1. A method for fabricating a semiconductor structure, the semiconductor structure comprising a first region and a second region adjacent to each other, the method comprising:

forming a first pattern on the first region and forming a second pattern on the second region, the first pattern comprising a plurality of first sub-patterns, a first gap being provided between adjacent two of the plurality of first sub-patterns, a width of the first gap being a first pitch, the second pattern comprising a plurality of second sub-patterns, a second gap being provided between adjacent two of the plurality of second sub-patterns, a width of the second gap being a second pitch, the second pitch being greater than the first pitch;

forming a first mask layer on a sidewall of the first pattern, and forming a second mask layer on a sidewall of the second pattern, the first mask layer filling up the first gap, and the second mask layer not filling up the second gap;

removing the first pattern and the second pattern;

forming a mask pattern layer, the mask pattern layer covering a top and the sidewall of the first pattern and filling up the first gap, the mask pattern layer covering a top and the sidewall of the second pattern and a bottom of the second gap, a third gap being provided between each of the plurality of first sub-patterns and each of the plurality of second sub-patterns adjacent to each other, and the mask pattern layer also covering a bottom of the third gap; and removing the mask pattern layer at the top of the first pattern, removing the mask pattern layer at the top of the second pattern and the mask pattern layer at the bottom of the second gap, and removing a portion of the mask pattern layer at the bottom of the third gap, to form the first mask layer in the first region and form the second mask layer in the second region; and, wherein before removing the mask pattern layer at the top of the first pattern, removing the mask pattern layer at the top of the second pattern and the mask pattern layer at the bottom of the second gap, and removing a portion of the mask pattern layer at the bottom of the third gap, and the method further comprises:

reducing a thickness of the mask pattern layer, such that the thickness of the second mask layer is a target thickness, wherein the thickness of the mask pattern layer is reduced by means of a wet etching process.

2. The method for fabricating a semiconductor structure according to claim 1, wherein a thickness of the mask pattern layer is a first thickness, the first pitch being less than twice the first thickness, and the second pitch being greater than twice the first thickness.

3. The method for fabricating a semiconductor structure according to claim 1, wherein a mask pattern material layer is deposited several times to obtain the mask pattern layer, a thickness of the mask pattern material layer deposited each time being a second thickness, and both the first pitch and the second pitch being greater than twice the second thickness.

4. The method for fabricating a semiconductor structure according to claim 1, wherein the mask pattern layer is formed by means of an atomic layer deposition process.

5. The method for fabricating a semiconductor structure according to claim 1, wherein the mask pattern layer comprises an oxide layer.

6. The method for fabricating a semiconductor structure according to claim 1, wherein the forming a first pattern on the first region and forming a second pattern on the second region comprise:

forming a photoresist layer on the first region and the second region; and patterning the photoresist layer to form the first pattern on the first region and form the second pattern on the second region.

7. The method for fabricating a semiconductor structure according to claim 1, wherein before the forming a first pattern on the first region and forming a second pattern on the second region, the method further comprises:

providing a stacked structure; and after the removing the first pattern and the second pattern, the method further comprises:

patterning the stacked structure based on the first mask layer and the second mask layer to obtain a target structure.

8. The method for fabricating a semiconductor structure according to claim 7, wherein the stacked structure comprises a first dielectric layer, a hard mask layer and a second dielectric layer stacked from bottom to top, the first pattern and the second pattern both being positioned above the second dielectric layer; and the patterning the stacked structure based on the first mask layer and the second mask layer comprises: patterning the second dielectric layer and the hard mask layer based on the first mask layer and the second mask layer.

9. The method for fabricating a semiconductor structure according to claim 8, wherein the first dielectric layer and the second dielectric layer both comprise a silicon oxynitride layer, the hard mask layer comprising a carbon layer.

10. The method for fabricating a semiconductor structure according to claim 7, wherein the target structure comprises a first target structure positioned in the first region and a second target structure positioned in the second region, the first target structure comprising a plurality of first target substructures, the second target structure comprising a plurality of second target substructures, and number of the plurality of second target substructures being greater than that of the plurality of first target substructures.

11. The method for fabricating a semiconductor structure according to claim 1, wherein the first mask layer comprises a plurality of third sub-patterns, a fourth gap being provided between adjacent two of the plurality of third sub-patterns, a width of the fourth gap being a fourth pitch, the second mask layer comprising a plurality of fourth sub-patterns, a fifth gap being provided between adjacent two of the plurality of fourth sub-patterns, a width of the fifth gap being a fifth pitch, the fifth pitch being greater than the fourth pitch, and after removing the first pattern and the second pattern, the method further comprising:

forming a third mask layer on a sidewall of the first mask layer, and forming a fourth mask layer on a sidewall of the second mask layer, the third mask layer filling up the fourth gap, and the fourth mask layer not filling up the fifth gap; and removing the first mask layer and the second mask layer.

12. The method for fabricating a semiconductor structure according to claim 11, wherein before forming a first pattern on the first region and forming a second pattern on the second region, the method further comprises:

providing a stacked structure; and after removing the first mask layer and the second mask layer, the method further comprises:

patterning the stacked structure based on the third mask layer and the fourth mask layer to obtain a target structure.

13. The method for fabricating a semiconductor structure according to claim 1, wherein the first mask layer comprises a plurality of third sub-patterns, a fourth gap being provided between adjacent two of the plurality of third sub-patterns, the second mask layer comprising a plurality of fourth sub-patterns, a fifth gap being provided between adjacent two of the plurality of fourth sub-patterns, and after removing the first pattern and the second pattern, the method further comprising:

forming a fifth mask layer on a sidewall of the first mask layer and forming a sixth mask layer on a sidewall of the second mask layer, the fifth mask layer not filling up the fourth gap, and the sixth mask layer not filling up the fifth gap; and     removing the first mask layer and the second mask layer.

14. The method for fabricating a semiconductor structure according to claim 13, wherein before forming a first pattern on the first region and forming a second pattern on the second region, the method further comprises:

providing a stacked structure; and after removing the first mask layer and the second mask layer, the method further comprises:

patterning the stacked structure based on the fifth mask layer and the sixth mask layer to obtain a target structure.

\* \* \* \* \*